(12) United States Patent
Kim

(10) Patent No.: US 7,526,005 B2
(45) Date of Patent: Apr. 28, 2009

(54) HIGHLY EFFICIENT SECOND HARMONIC GENERATION (SHG) VERTICAL EXTERNAL CAVITY SURFACE EMITTING LASER (VECSEL) SYSTEM

(75) Inventor: Jun-youn Kim, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/585,898

(22) Filed: Oct. 25, 2006

(65) Prior Publication Data

US 2007/0147444 A1 Jun. 28, 2007

(30) Foreign Application Priority Data

Dec. 23, 2005 (KR) .................. 10-2005-0128743

(51) Int. Cl.
*H01S 3/10* (2006.01)
(52) U.S. Cl. .................. 372/22; 372/70; 353/94
(58) Field of Classification Search .............. 353/31, 353/94; 372/22, 99, 50.11, 23, 72
See application file for complete search history.

(56) References Cited

U.S. PATENT DOCUMENTS

| | | | | |
|---|---|---|---|---|
| 5,048,030 A | * | 9/1991 | Hiiro | 372/68 |
| 6,370,168 B1 | * | 4/2002 | Spinelli | 372/22 |
| 6,393,038 B1 | * | 5/2002 | Raymond et al. | 372/22 |
| 6,680,956 B2 | * | 1/2004 | Gerstenberger et al. | 372/20 |
| 7,322,704 B2 | * | 1/2008 | Shchegrov | 353/94 |
| 7,357,513 B2 | * | 4/2008 | Watson et al. | 353/31 |
| 7,359,420 B2 | * | 4/2008 | Shchegrov et al. | 372/50.124 |
| 2005/0169323 A1 | * | 8/2005 | Spariosu et al. | 372/9 |
| 2007/0116078 A1 | * | 5/2007 | Kim | 372/50.124 |

* cited by examiner

*Primary Examiner*—Minsun Harvey
*Assistant Examiner*—Tuan N. Nguyen
(74) *Attorney, Agent, or Firm*—Buchanan Ingersoll & Rooney PC

(57) ABSTRACT

A Vertical External Cavity Surface Emitting Laser (VECSEL) system is provided. The VECSEL system includes a laser device including an active layer in which laser light is generated by pumping and a reflector reflecting the laser light generated in the active layer; an optical element that forms a cavity together with the reflector of the laser device and reduces a line width of laser light; and a SHG (Second Harmonic Generation) device that is disposed between the laser device and the optical element and doubles the frequency of laser light.

13 Claims, 4 Drawing Sheets

HIGHLY EFFICIENT SECOND HARMONIC GENERATION (SHG) VERTICAL EXTERNAL CAVITY SURFACE EMITTING LASER (VECSEL) SYSTEM

CROSS-REFERENCE TO RELATED PATENT APPLICATION

This application claims the benefit of Korean Patent Application No. 10-2005-0128743, filed on Dec. 23, 2005, in the Korean Intellectual Property Office, the disclosure of which is incorporated herein in its entirety by reference.

BACKGROUND OF THE DISCLOSURE

1. Field of the Disclosure

The present disclosure relates to a vertical external cavity surface emitting laser (VECSEL) system, and more particularly, to a highly efficient SHG VECSEL system achieving increased wavelength conversion efficiency of a SHG device by reducing laser light's linewidth.

2. Description of the Related Art

VECSELs increase a gain region by adopting an external mirror instead of an upper mirror for a Vertical Cavity Surface Emitting Laser (VCSEL) and obtain a high output power of several to several tens of watts (W) or higher.

FIG. 1 schematically illustrates a typical VECSEL system 10. Referring to FIG. 1, the typical VECSEL system 10 includes a VECSEL device 18, a first mirror 15 obliquely disposed from the VECSEL device 18, and a second mirror 17 reflecting light from the first mirror 15 back into the first mirror 15. The VECSEL system 10 further includes a SHG crystal 16 that is disposed in an optical path between the first and second mirrors 15 and 17 and converts light into light with double the frequency (half the wavelength) and a birefringence filter 14 that is disposed in an optical path between the first mirror 15 and the VECSEL device 18.

The VECSEL device 18 is used to implement a VECSEL system and does not include an upper reflector required by a VCSEL. That is, the VECSEL device 18 includes a distributed Bragg reflector and an active layer. The VECSEL system consists of the VECSEL device 18 and the second mirror 17 that is an external mirror forming a cavity of the VECSEL device 18 together with the reflector of the VECSEL device 18.

The VECSEL device 18 further includes a heat spreader 13 dissipating heat generated in the active layer in order to cool the active layer. The active layer has a resonant periodic gain (RPG) structure with multiple periods of alternating quantum well and barrier layers. A pump beam emitted by a pumping laser (not shown) is absorbed in the quantum well layers so that electrons and holes excited by the pump beam recombine to generate light.

In the above-mentioned structure, the active layer is excited by a pump beam that is emitted by the pumping laser and is incident thereon and emits light of a predetermined wavelength. Laser light pumped by the pump beam and generated in the active layer is reflected by the reflector and then is emitted from the VECSEL device 18 toward the first mirror 15. The laser light reflected from the first mirror 15 passes through the SHG crystal 16 and is incident on the second mirror 17. The laser light has half the wavelength as it passes through the SHG crystal 16.

The wavelength-converted light is reflected from the second mirror 17 and then is emitted through the first mirror 15. The birefringence filter 14 filters out only laser light so that only the laser light of a specific wavelength can resonate.

The SHG crystal 16 has a high wavelength conversion efficiency only in a very narrow wavelength region. In other words, the SHG crystal 16 exhibits wavelength conversion efficiency characteristics over a very narrow Full-Width at Half Maximum (FWHM). For example, when a Periodically Poled Stoichiometric Lithium Tantalate (PPSLT) is used as the SHG crystal 16, the SHG crystal 16 has a high wavelength conversion efficiency for a FWHM of about 0.1 to 0.2 nm.

However, because laser light in an infrared region generated by the VECSEL device 18 exhibits a larger FWHM, the wavelength conversion efficiency of the SHG crystal 16 may be degraded.

For example, in the absence of the birefringence filter 14 and the heat spreader 13, the VECSEL system 10 cannot achieve high wavelength-conversion efficiency for the SHG crystal 16 because laser light emitted by the VECSEL device 18 has a large FWHM of about 1.6 nm.

Thus, the use of birefringence filter 14 and the heat spreader 13 may reduce the FWHM of laser light to some extent. It is known that the FWHM of the laser light passing through the heat spreader 13 and the birefringence filter 14 decreases as the thickness of the birefringence filter 14 and the heat spreader 13 increases.

For example, when a 30-µm-thick heat spreader 13 and a 4-mm-thick birefringence filter 14 are used, the laser light has FWHMs of about 0.29 nm and about 0.35 nm at central wavelengths of 920 nm and 1,064 nm, respectively. When a 500-µm-thick heat spreader 13 and a 4-mm-thick birefringence filter 14 are used, the laser light has FWHMs of about 0.28 nm and about 0.3 nm at central wavelengths of 920 nm and 1,064 nm, respectively. In this way, when the thickness of the birefringence filter 14 is unchanged, the FWHM of laser light decreases as the thickness of the heat spreader 13 increases.

On the other hand, when the thickness of the heat spreader 13 has a fixed value, the FWHM of laser light decreases as the thickness of the birefringence filter 14 increases. For example, when a 500-µm-thick heat spreader 13 and 4-, 5-, and 6-mm-thick birefringence filters 14 are used, the laser light has FWHMs of about 0.29. 0.275, and 0.26 nm at central wavelength of 920 nm, respectively, while it has FWHMs of about 0.3, 0.285, 0.27 nm at central wavelength of 1,064 nm, respectively.

In the absence of the heat spreader 13, when no birefringence filter is used and the thickness of the birefringence filter 14 is 4, 5, and 6 mm, the FWHM of laser light is about 1.6 mm, 0.4, 0.36, and 0.32 nm, respectively. That is, when the VECSEL system 10 does not have the heat spreader 13, the FWHM of laser light decreases as the thickness of birefringence filter 14 increases.

However, when PPSLT is used as the SHG crystal 16, laser light must have a FWHM of about 0.1 to 0.2 nm in order to achieve high wavelength conversion efficiency. Thus, to obtain a sufficiently small FWHM, the thickness of the birefringence filter 14 and the heat spreader 13 must be increased significantly compared to those exemplified above.

The increase in the thickness of the birefringence filter 14 and the heat spreader 13 significantly increases the material costs and the size of the entire VECSEL system 10. Furthermore, this results in high optical loss and low laser output power.

Thus, there is a restriction on reducing the FWHM of laser light by increasing the thickness of the birefringence filter 14 and the heat spreader 13. It is nearly impossible to actually obtain the desired FWHM of laser light by decreasing the thickness of the birefringence filter 14 and the heat spreader 13.

SUMMARY OF THE DISCLOSURE

The present invention may provide a highly efficient Second Harmonic Generation (SHG) Vertical External Cavity Surface Emitting Laser (VECSEL) system providing high SHG efficiency by adequately reducing the Full-Width at Half Maximum (FWHM) of laser light and allowing easier alignment than a conventional system.

According to an aspect of the present invention, there may be provided a ) VECSEL (Vertical External Cavity Surface Emitting Laser) system including: a laser device including an active layer in which laser light is generated by pumping and a reflector reflecting the laser light generated in the active layer; an optical element that forms a cavity together with the reflector of the laser device and reduces a linewidth of laser light; and a SHG (Second Harmonic Generation) device that is disposed between the laser device and the optical element and doubles the frequency of laser light.

The optical element may be a reflective VBG (Volume Bragg Grating).

The optical element may reflect greater than 90% of laser light generated by the laser device and incident thereon toward the SHG device by reducing the linewidth of the laser light to a FWHM (Full-Width at Half Maximum) of less than 0.2 nm.

The VECSEL system may further include a mirror that is disposed between the SHG device and the laser device and reflects light incident from the laser device toward the SHG device, reflects most of the laser light generated by the laser device, and transmits laser light wavelength-converted by the SHG device.

The optical element may transmit laser light wavelength-converted by the SHG device.

The VECSEL system may further include a mirror element that is disposed in an optical path between the SHG device and the laser device and transmits laser light generated by the laser device and reflects laser light wavelength-converted by the SHG device.

The VECSEL system may further include a lens element that is disposed in an optical path between the SHG device and the laser device and focuses the laser light on the SHG device.

The VECSEL system may further include a polarization control plate that is disposed in an optical path between the SHG device and the laser device at a Brewster's angle to the laser light from the laser device and is transparent to the light generated by the laser device, and the polarization control plate is any one of a Brewster's angle plate and a Brewster's angle etalon.

The polarization control plate may have a thickness of approximately 10 to 500 μm.

The polarization control plate may be formed of a material selected from the group consisting of GaAs, InP, SiC and $Al_2O_3$.

The VECSEL system may further include at least one pumping light sources providing a pump beam to the active layer.

The VECSEL system may further include a heat spreader that is disposed on one side of the laser device and dissipates heat away that is generated in the laser device.

The heat spreader may be disposed toward a side of the laser device from which laser light is emitted and acts as an etalon.

The heat spreader may be formed of a material selected from the group consisting of diamond, SiC and $Al_2O_3$.

BRIEF DESCRIPTION OF THE DRAWINGS

The above and other features and advantages of the present invention will be described in detailed exemplary embodiments thereof with reference to the attached drawings in which.

DETAILED DESCRIPTION OF EXEMPLARY EMBODIMENTS

Exemplary Vertical External Cavity Surface Emitting Laser (VECSEL) systems according to preferred embodiments of the present invention will now be described in detail with reference to the accompanying drawings.

Figure 2:
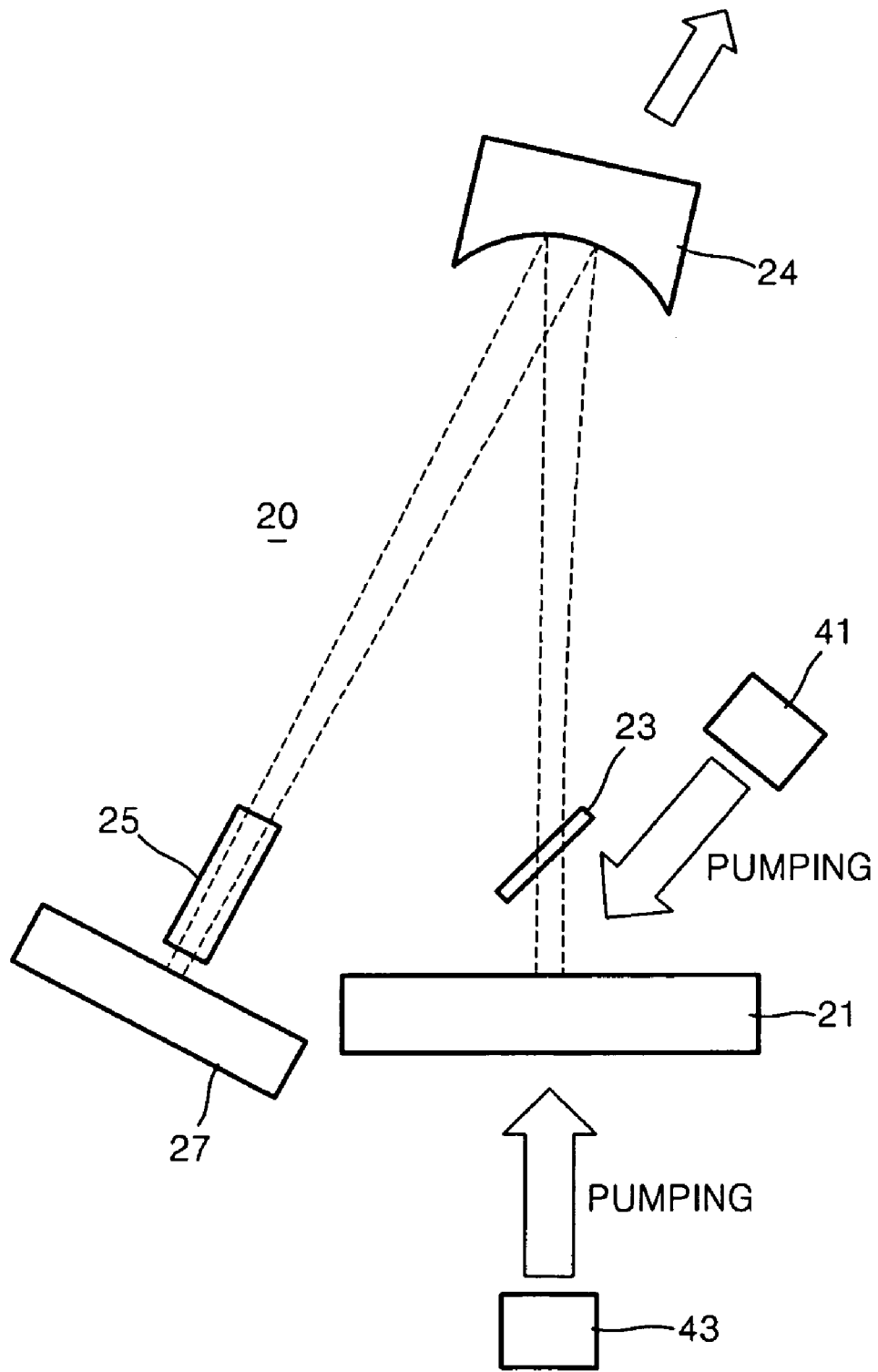
FIG. 2 schematically illustrates a VECSEL system according to an embodiment of the present invention.
Figure 3:
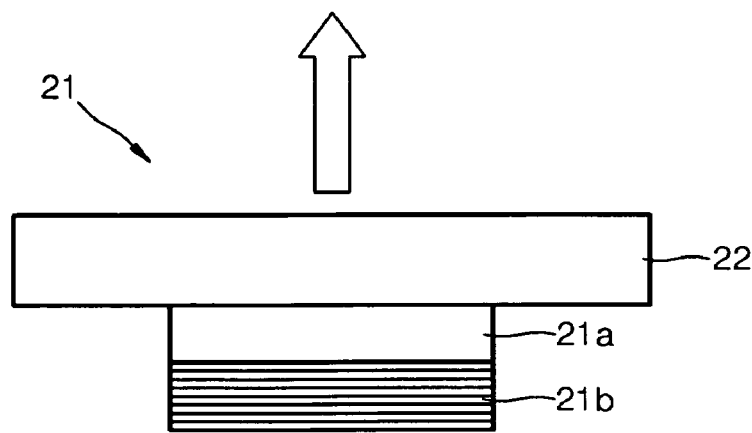
FIG. 3 further illustrates an example of the laser device shown in FIG. 2.

FIG. 2 schematically illustrates a VECSEL system 20 according to an embodiment of the present invention and FIG. 3 illustrates an example of the VECSEL system 21 shown in FIG. 2;

Referring to FIGS. 2 and 3, the VECSEL system 20 includes a VECSEL device 21 (a laser device) having an active layer 21a and a reflector 21b, a Second Harmonic Generation (SHG) device 25 converting laser light emitted by the VECSEL system 21 into laser light with double the frequency (half the wavelength), a mirror 24 obliquely disposed from the VECSEL system 21, and an optical element 27 forming a cavity together with a reflector 21b of the VECSEL system 21 by reflecting light from the mirror 24 back into the mirror 24 and reducing the FWHM of a reflected light beam. The VECSEL system 20 according to an embodiment of the present invention further includes a polarization control plate 23 disposed in an optical path between the VECSEL system 21 and the mirror 23.

The VECSEL system 21 may emit laser light in an infrared wavelength region. For example, the VECSEL system 21 may emit light having wavelength of about 920 nm, 1,064 nm, or 1,250 nm to obtain blue (B) light of about 460 nm, green (G) light of 532 nm, or red (R) light of about 625 nm due to SHG.

Referring to FIG. 3, the VECSEL system 21 includes the active layer 21 a generating light and the reflector 21b reflecting the light generated in the active layer 21a. The VECSEL system 21 has a similar structure to that of a Vertical Cavity Surface Emitting Laser (VCSEL) without an upper reflector.

The VECSEL system 21 further includes a heat spreader 22 disposed on one side of the VECSEL system 21. While FIG. 3 shows that the heat spreader 22 is attached (bonded) onto the VECSEL system 21 (a surface of the VECSEL system 21 where laser light is emitted), the VECSEL system 21 may be attached onto the heat spreader 22.

The active layer 21a of the VECSEL system 21 has a multi-quantum well (MQW) structure with Resonant Periodic Gain (RPG) and is excited by pump light provided by pumping light sources 41 and 43 to emit a laser beam of a predetermined wavelength, preferably, in an infrared region. In this instance, the wavelength of the pump light must be shorter than that of the light that will be generated in the active layer 21a.

Figure 4:
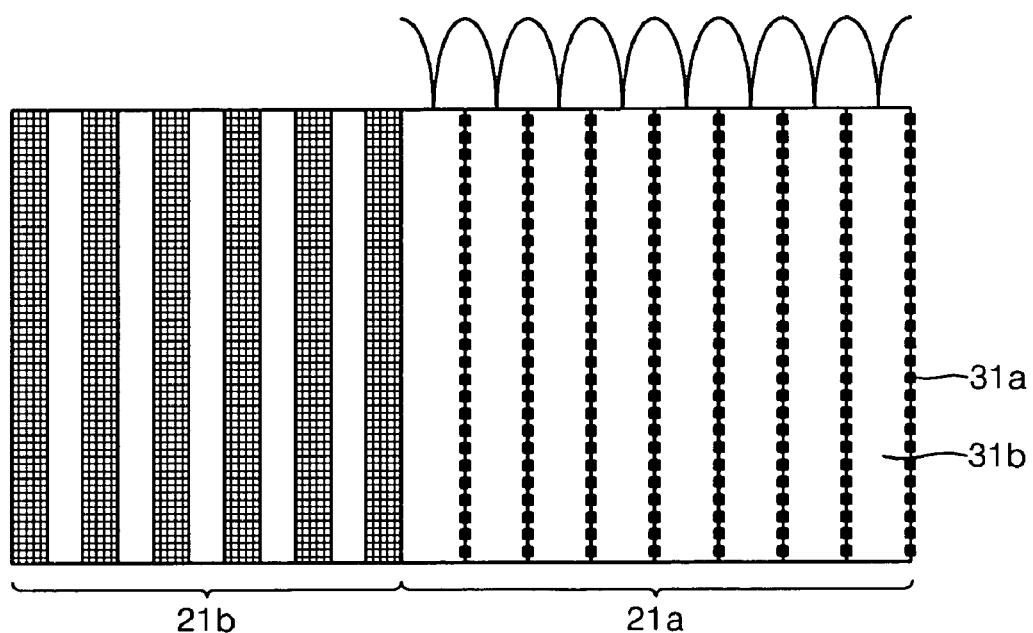
FIG. 4 illustrates the structure of the reflector and the active layer for the laser device of FIG. 3.

FIG. 4 illustrates the structure of the reflector 21b and the active layer 21a for the VECSEL system 21. Referring to FIG. 4, the active layer 21a may have a RPG structure with a plurality of alternating quantum well layer 31a and barrier layer 31b. A pump light beam emitted by the pumping light sources 41 and 43 is absorbed in the quantum well layer 31a and the barrier layer 31b. Electrons and holes recombine in the quantum well layer 31a to emit light.

The emitted light forms a standing wave between the reflector 21b and the optical element 27 forming a cavity with the reflector 21b. As shown in FIG. 4, in order to maximize the gain of a pumped light beam, the quantum well layer 31a is placed at an anti-node (a point where displacement is maximum) of a standing wave laser beam having a central wavelength among laser beams resonating between the reflector 21b and the optical element 27.

In this instance, the wavelength of light generated in the active layer 21a varies depending on the composition ratio of each atom or thickness of the quantum well layer 31a. Thus, light of the desired wavelength can be generated in the active layer 21a by appropriately adjusting the composition ratio of each atom in the quantum well layer 31a or the thickness of the quantum well layer 31a. Typically, when each atom in a quantum well layer has the same percent composition, the wavelength of light generated increases as the thickness of the quantum well layer increases.

The reflector 21b is a highly reflective Distributed Bragg Reflector (DBR) mirror layer that reflects a laser beam generated in the active layer 21a so that the laser beam resonates between the reflector 21b and the optical element 27 acting as an external mirror.

The heat spreader 22 dissipates away heat generated within the VECSEL system 21, in particular, the active layer 21a, to cool the active layer 21a. The heat spreader 22 may be formed of a material that is transparent to a pump beam and an infrared light beam generated by the VECSEL system 21. For example, the heat spreader 22 may be made from a material ensuring excellent heat dissipation, such as diamond, silicon carbide (SiC), $Al_2O_3$, or a mixture containing at least two of the above materials. The material is transparent to both the pump beam and the infrared light beam generated by the VECSEL system 21.

When the heat spreader 22 is disposed on the side of the VECSEL system 21 from which lased light beam is emitted as shown in FIG. 3, the VECSEL system 21 includes a stack of the reflector 21b, the active layer 21a, and the heat spreader 22. When being disposed in this way, the heat spreader 22 may act as both a heat dissipater and an etalon separating a specific wavelength out of a plurality of wavelengths.

Typically, laser light resonating within a cavity formed by a reflector of the laser device and an external mirror (optical element 27 in the present embodiment) consists of a spectrum of wavelengths having a peak at central wavelength. The spectrum contains multiple discrete wavelengths that can satisfy the resonance condition. However, because the interval between discrete wavelengths is small when a cavity length is large, the spectrum consists of nearly continuous wavelengths so that laser light has a predetermined linewidth. In this instance, the Full-Width at Half Maximum (FWHM) of the laser light is defined as a width between two wavelengths having half the intensity of a central wavelength.

Laser light that is generated in the active layer 21a and enters the heat spreader 22 is partially reflected from an interface adjacent to air that is an external medium of the heat spreader 22 and then partially is reflected from an interface between the heat spreader 22 and the active layer 21a. Therefore, because the laser light is repeatedly reflected between the top and bottom surfaces of the heat spreader 22, interference complexly occurs within the heat spreader 22, thus causing transmittance through the heat spreader 22 to periodically vary depending on a change of wavelength. That is, only a laser beam having a wavelength whose integer multiple is an optical distance between the top and bottom surface of the heat spreader 22 can escape through the top surface of the heat spreader 22. For example, when diamond having a thickness of 500 μm is used as the heat spreader 22, a free spectral range (FSR) and a FWHM are about 0.8 nm and 0.3 nm, respectively. Thus, only a beam having a wavelength of a specific mode among laser beams generated in the active layer 21a is transmitted through the heat spreader 22. The FWHM of the laser beam generated by the VECSEL system 21 is decreased as it passes through the heat spreader 22. When the heat spreader 22 acting as an etalon is disposed onto a side of the VECSEL system 21 where a laser beam is emitted, the FWHM of the laser beam is decreased to some extent as the laser beam passes through the heat spreader 22.

The SHG device 25 is disposed in a path along which a laser beam emitted by the VECSEL system 21 propagates to generate second harmonics. The SHG device 25 doubles the frequency of a laser beam generated by the VECSEL system 21 and thus reduces the wavelength by half as the laser beam passes through itself. For example, when an infrared laser beam having a central wavelength of about 920 nm is generated by the VECSEL system 21, the infrared laser beam is converted into a green beam with a central wavelength of about 460 nm as it passes through the SHG device 25. When an infrared laser beam having a central wavelength of about 1,064 nm is generated by the VECSEL system 21, the infrared laser beam is converted into a green beam with a central wavelength of about 532 nm as it passes through the SHG device 25. When an infrared laser beam having a central wavelength of about 1,250 nm is generated by the VECSEL system 21, the infrared laser beam is converted into a red beam with a central wavelength of about 625 nm as it passes through the SHG device 25.

As described above, the SHG device 25 has high wavelength conversion efficiency with a very narrow wavelength linewidth. That is, a SHG crystal used as the SHG device 25 generally exhibits wavelength conversion efficiency characteristics over a very narrow FWHM. When a Periodically Poled Stoichiometric Lithium Tantalate (PPSLT) is used as the SHG crystal, the SHG crystal has a high wavelength conversion efficiency for a FWHM of about 0.1 to 0.2 nm. However, as described earlier, a laser beam in an infrared region emitted by the VECSEL system 21 has a significantly larger FWHM.

The SHG device 25 may be disposed in an optical path between the optical element 27 reducing the FWHM of a laser beam and the mirror 24.

In the laser system according to the present embodiment, a laser beam generated by the laser beam 21 and having decreased FWHM passes through the SHG device 27 that is disposed between the optical element 27 and the mirror 24, thus increasing the wavelength conversion efficiency of the SHG device 25 and obtaining a high power wavelength-converted laser beam.

A laser beam emitted by the VECSEL system 21 passes through the SHG device 25 after being reflected from the mirror 24. The wavelength conversion efficiency for the SHG device 25 increases as the intensity of incident light increases. Thus, a reflecting surface of the mirror 24 may be convex so that the laser beam can be focused on the SHG device 25.

The mirror 24 is coated to have different reflectance and transmittance depending on a wavelength. For example, the mirror 24 may be coated to have transmittance with respect to a laser beam wavelength-converted by the SHG device and high reflectance with respect to a non-wavelength-converted laser beam (sometimes referred to as a "lasing beam" to distinguish it from a wavelet-converted laser beam).

In the present embodiment, the optical element 27 forms a cavity together with the reflector 21b of the VECSEL system 21 and reduces the FWHM of the laser beam. The optical element 27 may have a high reflectance with respect to an incident laser beam (both of a wavelength-converted laser beam and a non-wavelet converted laser beam).

A reflective Volume Bragg Grating (VBG) may be used as the optical element 27 in order to achieve a high reflectance and reduce the FWHM of the laser beam to a desired width.

The reflective VBG for the optical element 27 may be designed to provide a high reflectance greater than 99% and reduce the FWHM of a laser beam to 0.2 nm or less (e.g., 0.05 to 0.2 nm) in order to achieve a high wavelength conversion efficiency for the SHG device 25. The reflective VBG used as the optical element 27 may be adjusted to have a linewidth of less than approximately 0.2 nm in a predetermined reflectance and a desired reflectance greater than 99%. The optical element 27 may be formed of a photorefractive material whose refractive index is changed by the illumination of light. The thickness of the reflective VBG may be adjusted to obtain the desired reflectance.

The use of reflective VBG, as the optical element 27, can achieve the desired narrow FWHM and high reflectance. Thus, because light reflected by the optical element 27 has a FWHM reduced to achieve high wavelength conversion by the SHG device 25, second harmonics are generated for a large amount of laser light as the light passes through the SHG device 25 in order to perform the wavelength conversion. As a result, a high wavelength conversion efficiency can be achieved, thus obtaining a high power visible laser light.

The polarization control plate 23 may be formed of a material that is transparent to lasing light from the VECSEL system 21 so that laser light of dominant specific polarization propagates toward the SHG 25. The polarization control plate 23 may be formed of GaAs, InP, SiC or diamond with a thickness of approximately 10 to 1,000 μm, preferably, approximately 10 to 500 μm. The polarization control plate 23 may be disposed close to the VECSEL system 21 within the cavity.

The polarization control plate 23 may be a transparent plate, i.e., a Brewster's angle plate disposed at a Brewster's angle to a lasing axis, i.e., a central axis of light incident from the VECSEL system 21. The Brewster's angle plate is a transparent plate placed at a Brewster's angle to the incident light. The Brewster's angle is an incident angle at which reflectance of light having p-polarization is zero. At this angle, the reflected light has s-polarization and the transmitted light has dominant p-polarization.

Alternatively, the polarization control plate 23 may be an etalon placed at a Brewster's angle to a central axis of light incident from the VECSEL system 21. That is, the polarization control plate 23 may be a Brewster's angle etalon.

As described above, because the VECSEL system 20 according the present embodiment uses the polarization control plate 23, the VECSEL system 20 transmits laser light having dominant p-polarization.

Figure 1:
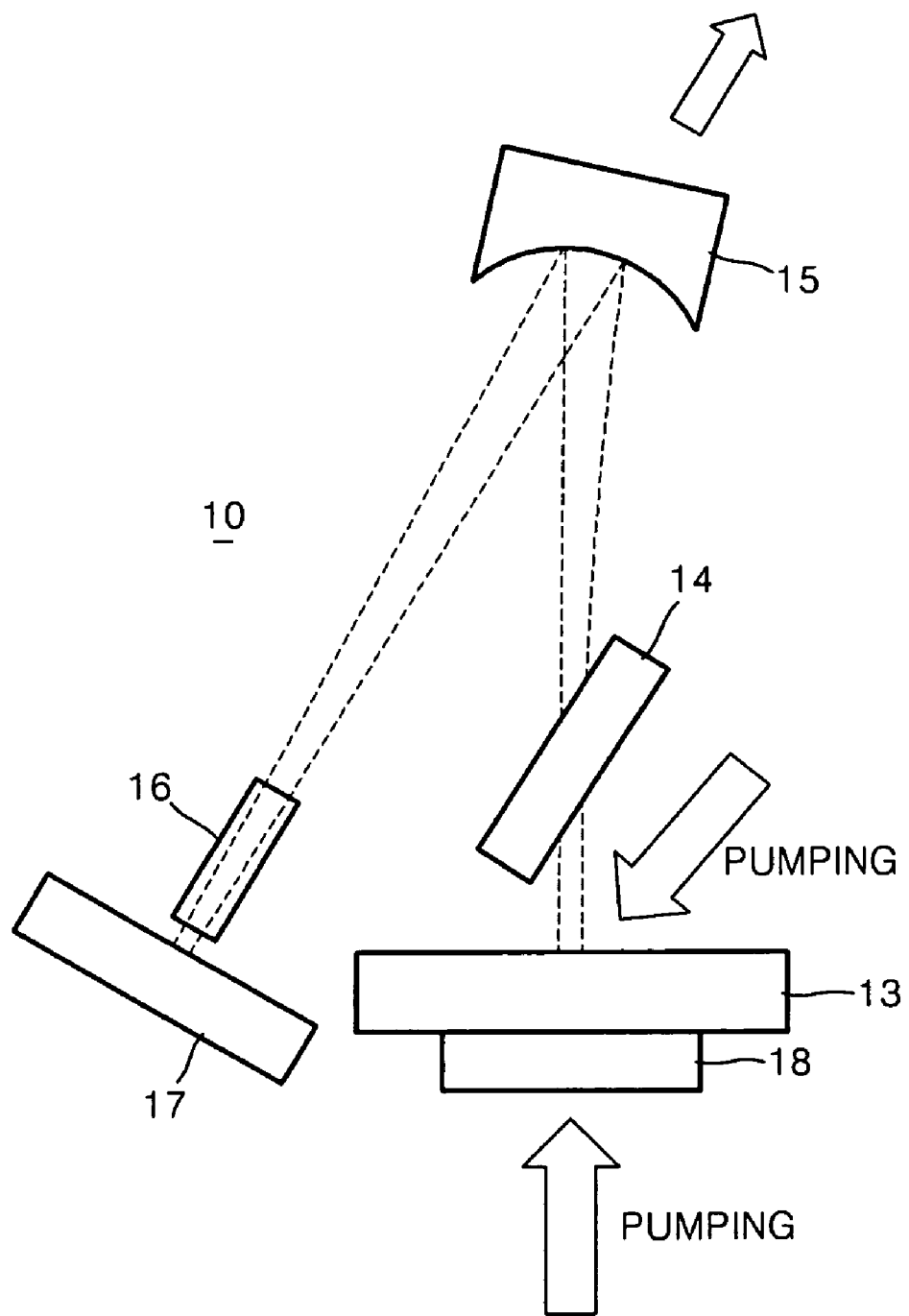
FIG. 1 schematically illustrates a typical Vertical External Cavity Surface Emitting Laser (VECSEL) system.

As described with reference to FIG. 1, the typical VECSEL system 10 uses the birefringence filter 14 that is disposed obliquely to propagating lasing light and transmits only laser light in a narrow wavelength range so that the light of the narrow wavelength range can participate in resonance in order to reduce the FWHM of lasing light being incident on the SHG device 16.

The birefringence filter 14 is wavelength-selective and polarization-selective. The SHG crystal possesses polarization dependence.

In the VECSEL system 20 according to the present embodiment, the optical element 27 that is the reflective VBG acts as an external mirror that forms a cavity and reduces the FWHM of laser light according to wavelength selection which is performed by the birefringence filter 14 in the typical VECSEL system 10. The polarization control plate 23 performs polarization control that is performed by the birefringence filter 14 in the typical VECSEL system 10.

The typical VECSEL system 10 uses the external mirror (17 of FIG. 1) disposed at a position corresponding to that of the optical element 27 for the VECSEL system 20 according to an embodiment of the present invention to consist of a cavity and the birefringence filter 14 performing wavelength selection and polarization control. The VECSEL system 20 according to the present embodiment including the optical element 27 that is the reflective VBG and the polarization control plate 23 that is the Brewster's angle plate or Brewster's angle etalon have the following advantages compared to the typical VECSEL system 10.

First, while the typical VECSEL system 10 including the birefringence filter 14 makes it practically impossible to reduce the FWHM of laser light to less than 0.2 nm, the VECSEL system 20 according to the present embodiment uses the VBG to sufficiently reduce the FWHM of laser light to less than 0.2 nm as the optical element 27, thus achieving a higher wavelength conversion efficiency than the typical VECSEL system 10.

Thus, when a laser beam in an infrared region is generated by the VECSEL system 21, the present invention can obtain high power visible laser light, thus providing a high power visible VECSEL system emitting the green (preferably, central wavelength of 532 nm), blue (preferably, central wavelength of 460 nm) or red laser light (preferably, central wavelength of 625 nm) necessary for display of a color image.

Because the reflective VBG used as the optical element 27 or polarization control plate 23 (Brewster's angle plate or Brewster's angle etalon) is significantly less expensive than the birefringence filter 14 in order to implement a laser system with FWHM of less than 0.2 nm, the manufacturing costs of the VECSEL system 20 according to the present invention can be significantly reduced.

Furthermore, unlike the birefringence filter 14 disposed at a precise angle, the polarization control plate 23 that is a Brewster's angle plate or Brewster's angle etalon can be disposed to reach a broad Brewster's angle, thus making alignment easier. Thus, the VECSEL system 20 of the present embodiment allows easy alignment of the optical components.

The VECSEL system 20 further includes the pumping light sources 41 and 43 providing pump beams so that laser light is generated in the active layer 21a of the VECSEL system 21 by light pumping. Referring to FIG. 2, the VECSEL system 20 includes the pumping light source 41 emitting a pump beam obliquely to a top surface of the VECSEL system 21 and the pumping light source 43 emitting a pump beam on a bottom surface of the VECSEL system 21. The VECSEL system 20 may include only one of the two pumping light sources 41 and 43.

The pumping light sources 41 and 43 may be laser light sources or other types of light sources. As described above, the wavelength of pump beams illuminated by the pumping light sources 41 and 43 must be shorter than that of light lased by the VECSEL system 21. For example, when the VECSEL system 21 generates infrared light in order to obtain red, green, or blue visible laser beam for the display of a color image due to SHG, the pumping light sources 41 and 43 may emit pump beams with a wavelength of about 808 nm.

In the above description, pumping occurs within the active layer 21*a* of the VECSEL system 21 due to pump beams provided by the pumping light sources 41 and 43. Alternatively, the VECSEL system 21 may generate lasing light by electric pumping induced by applying current to electrodes. In the latter case, pumping light sources are not needed.

The VECSEL system 20 of the present embodiment obtains a laser beam with half the wavelength of the lasing beam generated from the VECSEL system 21 by SHG through the following process. First, because laser light emitted by the VECSEL system 21 and reflected from the mirror 24 has a large linewidth (FWHM), only a portion of the laser light is converted into light with half the wavelength as it passes through the SHG device 25 while a large amount of the laser light passes through the SHG device 25 without being wavelength-converted. The non-wavelength-converted laser light passing through the SHG device 25 is then incident on the optical element 27. The optical element 27 then reflects only a laser beam with a narrow linewidth among incident laser light so that the reflected laser beam propagates along the original optical path. Thus, the reflected laser light having a sufficiently reduced FWHM passes through the SHG device 25 again. Because a significant amount of the laser light is wavelength converted due to the reduced FWHM, most of the laser light is converted into its half wavelength light that then escapes through the mirror 24.

Figure 5:
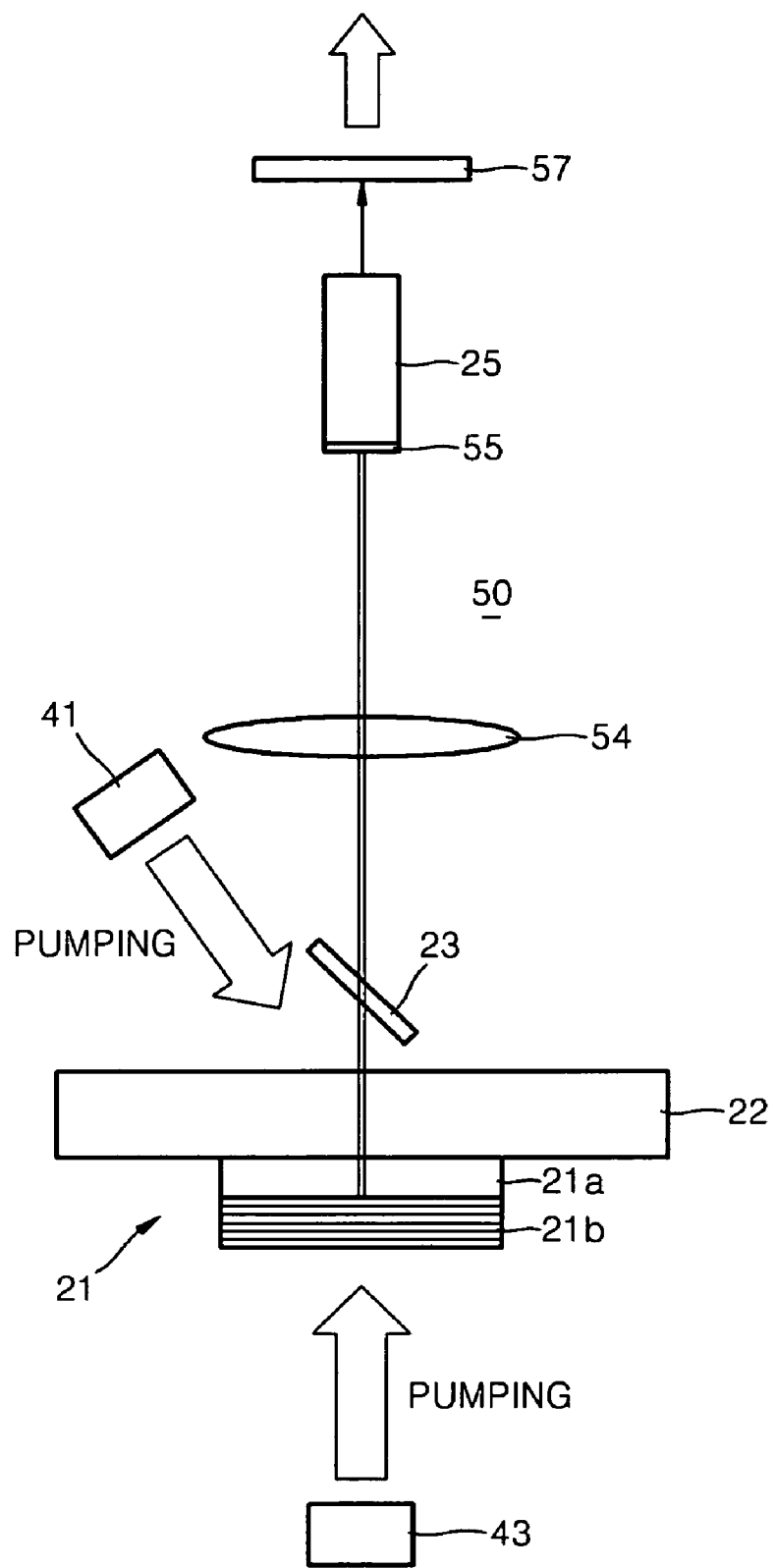
FIG. 5 schematically illustrates a VECSEL system according to another embodiment of the present invention.

FIG. 5 schematically illustrates a VECSEL system 50 according to another embodiment of the present invention. The VECSEL system 50 uses a lens element 54 instead of the mirror 24 shown in FIG. 2 and is designed such that laser light with half the wavelength of light generated by a VECSEL system 21 escapes through an optical element 57. Like reference numerals in FIGS. 2 and 5 denote like elements, and thus their description is being omitted.

Referring to FIG. 5, in the VECSEL system 50, the lens element 54 focuses laser light emitted by the VECSEL system 21 on a SHG device 25. In the present embodiment, the optical element 57 forms a cavity together with a reflector 21*b* of the VECSEL system 21. The optical element 57 also reflects laser light, e.g., in an infrared wavelength region, which is emitted by the VECSEL system 21 and passes through the SHG device 25 without being wavelength-converted by reducing its FWHM while transmitting laser light wavelength-converted by the SHG device 25. The optical element 57 may be a reflective VBG that can reflect greater than 99% of the non-wavelength-converted laser light by reducing its linewidth to a FWHM of less than 0.2 nm and transmit the wavelength-converted laser light, e.g., visible laser light. The optical element 57 has substantially the same configuration as the counterpart in the VECSEL system 20 except that it transmits laser light wavelength-converted by the SHG device 25.

In the VECSEL system 50, the laser light is repeatedly reflected between the optical element 57 and the reflector 21*b* of the VECSEL system 21 so as to resonate. Because the optical element 57 has a predetermined transmittance with respect to laser light with the frequency doubled (wavelength half-reduced) by the SHG device 25, the laser light with half the wavelength can escape perpendicularly through the optical element 57 towards the outside.

The VECSEL system 50 further includes a mirror element 55 that is disposed in an optical path between the VECSEL system 21 and the SHG device 25 and reflects laser light wavelength-converted by the SHG device 25 towards the optical element 57 and transmits non-wavelength-converted laser light. Referring to FIG. 5, the mirror element 55 may be disposed on a surface of the SHG device 25 facing the VECSEL system 21 and may be a coating layer, e.g., consisting of multiple thin films that prevent reflection of lasing light but totally reflects wavelength-converted laser light. The mirror element 55 may be disposed between the VECSEL system 21 and the SHG device 25, separately from the SHG device 25.

The VECSEL system 50 allows wavelength-converted laser light to escape through the following process. First, because laser light emitted by the VECSEL system 21 and focused on the SHG device 25 by the lens element 54 has a large linewidth (FWHM), only a portion of the laser light is converted into light with half the wavelength as it passes through the SHG device 25 while a large amount of the laser light is not wavelength-converted by the SHG device 25. The non-wavelength-converted laser light passing through the SHG device 25 is then incident on the optical element 57. The optical element 57 then reflects only a laser beam with a narrow linewidth among incident laser light so that the reflected laser beam propagates along the original optical path. Thus, the reflected laser light having a sufficiently reduced FWHM passes through the SHG device 25 again. Because a significant amount of the laser light is wavelength converted due to the reduced FWHM, most of the laser light is converted into its half wavelength light that is then reflected by the mirror element 55 towards the optical element 57 through the SHG device 25. The wavelength-converted laser light then escapes perpendicularly through the optical element 57 towards the outside.

A VECSEL system according to the present invention uses a reflective VBG as an external mirror forming a cavity together with a reflector of a VECSEL device to significantly reduce the FWHM of laser light compared to a typical VECSEL system using a birefringence filter. Thus, the present invention can achieve a high wavelength conversion efficiency for a SHG device, thus providing a VECSEL system emitting high power visible laser light.

The VECSEL system of the present invention also uses a plate disposed at a Brewster's angle for polarization control, thus allowing significantly easier alignment than a typical VECSEL system including a birefringence filter disposed at a precise angle.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A VECSEL (Vertical External Cavity Surface Emitting Laser) system comprising:
   a laser device including an active layer in which laser light is generated by pumping and a reflector reflecting the laser light generated in the active layer;
   an optical element that forms a cavity together with the reflector of the laser device and reduces a linewidth of laser light;
   a SHG (Second Harmonic Generation) device that is disposed between the laser device and the optical element and doubles the frequency of laser light;
   a polarization control plate that is disposed in an optical path between the SHG device and the laser device at a Brewster's angle to the laser light from the laser device and is transparent to the light generated by the laser device, and the polarization control plate is any one of a Brewster's angle plate and a Brewster's angle etalon, wherein the optical element is a reflective VBG (Volume Bragg Grating) that reflects greater than 90% of laser light generated by the laser device and incident thereon toward the SHG device by reducing the linewidth of the laser light to a FWHM (Full-Width at Half Maximum) of less than approximately 0.2 nm, and wherein the polarization control plate is formed of a material selected from the group consisting of GaAs, InP, SiC and $Al_2O^3$.

2. The VECSEL system of claim 1, further comprising a mirror that is disposed between the SHG device and the laser device and reflects light incident from the laser device toward the SHG device, reflects most of the laser light generated by the laser device, and transmits laser light wavelength-converted by the SHG device.

3. The VECSEL system of claim 1, wherein the optical element transmits laser light wavelength-converted by the SHG device.

4. The VECSEL system of claim 3, further comprising a mirror element that is disposed in an optical path between the SHG device and the laser device and transmits laser light generated by the laser device and reflects laser light wavelength-converted by the SHG device.

5. The VECSEL system of claim 3, further comprising a lens element that is disposed in an optical path between the SHG device and the laser device and focuses the laser light on the SHG device.

6. The VECSEL system of claim 1, wherein the polarization control plate has a thickness of approximately 10 to 500 μm.

7. The VECSEL system of claim 1, further comprising at least one pumping light sources providing a pump beam to the active layer.

8. The VECSEL system of claim 1, further comprising a heat spreader that is disposed on one side of the laser device and dissipates away heat generated in the laser device.

9. The VECSEL system of claim 8, wherein the heat spreader is disposed toward a side of the laser device from which laser light is emitted and acts as an etalon.

10. The VECSEL system of claim 1, further comprising at least one pumping light sources providing a pump beam to the active layer.

11. The VECSEL system of claim 1, further comprising a heat spreader that is disposed on one side of the laser device and dissipates away heat generated in the laser device.

12. The VECSEL system of claim 11, wherein the heat spreader is disposed toward a side of the laser device from which laser light is emitted and acts as an etalon.

13. The VECSEL system of claim 12, wherein the heat spreader is formed of a material selected from the group consisting of diamond, SiC and $Al_2O_3$.

* * * * *